US009748937B1

(12) United States Patent
Inamdar

(10) Patent No.: US 9,748,937 B1
(45) Date of Patent: Aug. 29, 2017

(54) SUPERCONDUCTING DIGITAL PHASE ROTATOR

(71) Applicant: Hypres, Inc., Elmsford, NY (US)

(72) Inventor: Amol Ashok Inamdar, Elmsford, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 15/155,687

(22) Filed: May 16, 2016

Related U.S. Application Data

(63) Continuation of application No. 14/743,409, filed on Jun. 18, 2015, now Pat. No. 9,344,069, which is a continuation of application No. 13/073,942, filed on Mar. 28, 2011, now Pat. No. 9,065,452, which is a continuation of application No. 11/625,013, filed on Jan. 19, 2007, now Pat. No. 7,917,798, which is a continuation-in-part of application No. 11/617,806, filed on Dec. 29, 2006, now abandoned.

(60) Provisional application No. 60/840,379, filed on Aug. 25, 2006.

(51) Int. Cl.
*H04L 7/00* (2006.01)
*H03K 5/131* (2014.01)
*H03K 3/38* (2006.01)
*H03L 7/16* (2006.01)
*H03K 5/00* (2006.01)

(52) U.S. Cl.
CPC ............. *H03K 5/131* (2013.01); *H03K 3/38* (2013.01); *H03L 7/16* (2013.01); *H03K 2005/00286* (2013.01)

(58) Field of Classification Search
CPC ............. H03K 5/131; H03K 3/38; H03K 2005/00286; H03L 7/16
USPC ........................................ 375/371; 370/480
See application file for complete search history.

(56) References Cited

U.S. PATENT DOCUMENTS

| | | | |
|---|---|---|---|
| 4,024,342 A | 5/1977 | Croisier et al. |
| 4,807,171 A | 2/1989 | Gale |
| 5,103,459 A | 4/1992 | Gilhousen et al. |
| 5,134,464 A | 7/1992 | Basile et al. |
| 5,202,693 A | 4/1993 | Lee |
| 5,282,019 A | 1/1994 | Basile et al. |
| 5,309,474 A | 5/1994 | Gilhousen et al. |
| 5,355,092 A | 10/1994 | Kosaka et al. |
| 5,396,523 A | 3/1995 | Hedberg |
| 5,414,728 A | 5/1995 | Zehavi |

(Continued)

*Primary Examiner* — Daniel Washburn
*Assistant Examiner* — Fitwi Hailegiorgis
(74) *Attorney, Agent, or Firm* — Steven M Hoffberg, Esq.; Ostrolenk Faber LLP

(57) ABSTRACT

An important component in digital circuits is a phase rotator, which permits precise time-shifting (or equivalently, phase rotation) of a clock signal within a clock period. A digital phase rotator can access multiple discrete values of phase under digital control. Such a device can have application in digital clock synchronization circuits, and can also be used for a digital phase modulator that encodes a digital signal. A digital phase rotator has been implemented in superconducting integrated circuit technology, using rapid single-flux-quantum logic (RSFQ). This circuit can exhibit positive or negative phase shifts of a multi-phase clock. Arbitrary precision can be obtained by cascading a plurality of phase rotator stages. Such a circuit forms a phase-modulator that is the core of a direct digital synthesizer that can operate at multi-gigahertz radio frequencies.

19 Claims, 20 Drawing Sheets

(56) References Cited

U.S. PATENT DOCUMENTS

| | | |
|---|---|---|
| 5,416,797 A | 5/1995 | Gilhousen et al. |
| 5,471,497 A | 11/1995 | Zehavi |
| 5,555,534 A | 9/1996 | Maslak et al. |
| 5,577,025 A | 11/1996 | Skinner et al. |
| 5,581,517 A | 12/1996 | Gee et al. |
| 5,600,675 A | 2/1997 | Engeler |
| 5,602,833 A | 2/1997 | Zehavi |
| 5,675,554 A | 10/1997 | Cole et al. |
| 5,685,308 A | 11/1997 | Wright et al. |
| 5,691,974 A | 11/1997 | Zehavi et al. |
| 5,715,236 A | 2/1998 | Gilhousen et al. |
| 5,751,761 A | 5/1998 | Gilhousen |
| 5,790,555 A * | 8/1998 | Narahashi ............... H03G 3/30 370/480 |
| 5,793,656 A | 8/1998 | Richmond et al. |
| 5,827,188 A | 10/1998 | Wright et al. |
| 5,841,806 A | 11/1998 | Gilhousen et al. |
| 5,882,307 A | 3/1999 | Wright et al. |
| 5,921,932 A | 7/1999 | Wright et al. |
| 5,928,152 A | 7/1999 | Wright et al. |
| 5,936,458 A | 8/1999 | Rylov |
| 5,943,361 A | 8/1999 | Gilhousen et al. |
| 5,946,359 A | 8/1999 | Tajiri et al. |
| 6,029,116 A | 2/2000 | Wright et al. |
| 6,047,017 A | 4/2000 | Cahn et al. |
| 6,172,939 B1 | 1/2001 | Cole et al. |
| 6,185,246 B1 | 2/2001 | Gilhousen |
| 6,249,542 B1 | 6/2001 | Kohli et al. |
| 6,310,869 B1 | 10/2001 | Holtzman et al. |
| 6,393,046 B1 | 5/2002 | Kohli et al. |
| 6,400,753 B1 | 6/2002 | Kohli et al. |
| 6,463,266 B1 | 10/2002 | Shohara |
| 6,466,612 B2 | 10/2002 | Kohli et al. |
| 6,466,630 B1 | 10/2002 | Jensen |
| 6,480,529 B1 | 11/2002 | Sih et al. |
| 6,559,800 B2 | 5/2003 | Rabinowitz et al. |
| 6,618,429 B2 | 9/2003 | Gilhousen et al. |
| 6,633,814 B2 | 10/2003 | Kohli et al. |
| 6,680,967 B1 | 1/2004 | Westman |
| 6,693,951 B1 | 2/2004 | Gilhousen et al. |
| 6,724,811 B2 | 4/2004 | Kohli et al. |
| 6,748,015 B2 | 6/2004 | Kohli et al. |
| 6,756,925 B1 | 6/2004 | Leung et al. |
| 6,760,364 B2 | 7/2004 | Kohli et al. |
| 6,775,530 B2 | 8/2004 | Severson et al. |
| 6,816,716 B2 | 11/2004 | Shohara |
| 6,961,020 B2 | 11/2005 | Robinowitz et al. |
| 6,985,705 B2 | 1/2006 | Shohara |
| 7,003,021 B2 | 2/2006 | Gilhousen et al. |
| 7,050,522 B2 | 5/2006 | Schmatz |
| 7,061,992 B2 | 6/2006 | Carlson et al. |
| 7,183,971 B1 | 2/2007 | Lloyd et al. |
| 7,301,992 B2 | 11/2007 | Kohli et al. |
| 7,376,206 B1 | 5/2008 | Simic et al. |
| 7,406,114 B2 | 7/2008 | Kohli et al. |
| 7,486,747 B1 | 2/2009 | Bagley et al. |
| 7,508,230 B2 | 3/2009 | Kirichenko |
| 7,522,899 B1 | 4/2009 | He |
| 7,529,320 B2 | 5/2009 | Byrne et al. |
| 7,593,454 B2 | 9/2009 | Rasmussen |
| 7,609,755 B2 | 10/2009 | Rasmussen |
| 7,724,840 B2 | 5/2010 | McCallister et al. |
| 7,729,413 B2 | 6/2010 | Kohli et al. |
| 7,839,960 B2 | 11/2010 | Gilhousen et al. |
| 7,917,798 B2 | 3/2011 | Inamdar |
| 7,953,174 B2 | 5/2011 | Asbeck et al. |
| 7,978,009 B2 | 7/2011 | Mu |
| 8,090,043 B2 | 1/2012 | Levi et al. |
| 8,391,426 B2 | 3/2013 | Wang et al. |
| 8,401,108 B1 | 3/2013 | Haddadin et al. |
| 8,461,901 B1 | 6/2013 | Morton et al. |
| 8,509,208 B2 | 8/2013 | Rimini et al. |
| 8,537,925 B2 | 9/2013 | Levi et al. |
| 8,724,739 B2 | 5/2014 | Morton et al. |
| 8,786,337 B2 | 7/2014 | Mohajeri et al. |
| 8,885,738 B2 | 11/2014 | Cohen et al. |
| 8,896,474 B2 | 11/2014 | Makinwa et al. |
| 8,938,043 B2 | 1/2015 | Bae et al. |
| 8,953,950 B2 | 2/2015 | Nazarathy et al. |
| 8,990,864 B2 | 3/2015 | Anandakumar et al. |
| 9,013,213 B2 | 4/2015 | Chandrashekar et al. |
| 9,048,847 B2 | 6/2015 | McLaurin et al. |
| 9,065,452 B1 | 6/2015 | Inamdar |
| 9,065,653 B2 | 6/2015 | Bae et al. |
| 9,094,004 B2 | 7/2015 | Hsieh et al. |
| 9,201,412 B2 | 12/2015 | Posa et al. |
| 9,203,418 B2 | 12/2015 | Mohajeri et al. |
| 9,222,850 B2 | 12/2015 | Couch et al. |
| 9,276,792 B1 | 3/2016 | Makinwa et al. |
| 9,314,226 B2 | 4/2016 | Hancock |
| 9,334,069 B1 | 5/2016 | Honda et al. |
| 9,344,069 B1 | 5/2016 | Inamdar |
| 2001/0009563 A1 | 7/2001 | Kohli et al. |
| 2002/0009170 A1 | 1/2002 | Schmatz |
| 2002/0015439 A1 | 2/2002 | Kohli et al. |
| 2002/0021683 A1 | 2/2002 | Holtzman et al. |
| 2002/0145565 A1 | 10/2002 | Rabinowitz et al. |
| 2002/0146065 A1 | 10/2002 | Kohli et al. |
| 2002/0150150 A1 | 10/2002 | Kohli et al. |
| 2002/0168035 A1 | 11/2002 | Carlson et al. |
| 2002/0191256 A1 | 12/2002 | Schemmann et al. |
| 2003/0053519 A1 | 3/2003 | Gilhousen et al. |
| 2003/0087617 A1 | 5/2003 | Shohara |
| 2003/0100286 A1 | 5/2003 | Severson et al. |
| 2003/0165186 A1 | 9/2003 | Kohli et al. |
| 2003/0179831 A1 * | 9/2003 | Gupta ................... H03F 1/3247 375/296 |
| 2003/0231133 A1 | 12/2003 | Robinowitz et al. |
| 2004/0037311 A1 | 2/2004 | Willes et al. |
| 2004/0136446 A1 | 7/2004 | Kohli et al. |
| 2004/0152965 A1 | 8/2004 | Diab et al. |
| 2004/0156427 A1 | 8/2004 | Gilhousen et al. |
| 2004/0184516 A1 | 9/2004 | Kohli et al. |
| 2004/0202235 A1 | 10/2004 | Kohli et al. |
| 2005/0062526 A1 | 3/2005 | Morris et al. |
| 2005/0078743 A1 | 4/2005 | Shohara |
| 2006/0083293 A1 | 4/2006 | Keegan et al. |
| 2006/0088134 A1 | 4/2006 | Gilhousen et al. |
| 2006/0208811 A1 | 9/2006 | Lee |
| 2007/0025430 A1 | 2/2007 | Rasmussen |
| 2007/0064836 A1 | 3/2007 | Byrne et al. |
| 2007/0127600 A1 | 6/2007 | Sato et al. |
| 2007/0160168 A1 | 7/2007 | Beukema et al. |
| 2008/0049885 A1 | 2/2008 | Inamdar |
| 2008/0101442 A1 | 5/2008 | Rasmussen |
| 2008/0130779 A1 | 6/2008 | Levi et al. |
| 2008/0144709 A1 | 6/2008 | McCallister et al. |
| 2008/0205493 A1 | 8/2008 | Kohli et al. |
| 2008/0285640 A1 | 11/2008 | McCallister et al. |
| 2009/0196274 A1 | 8/2009 | Rimini et al. |
| 2009/0244399 A1 | 10/2009 | Cohen et al. |
| 2011/0025415 A1 | 2/2011 | Mu |
| 2012/0093244 A1 | 4/2012 | Levi et al. |
| 2012/0114076 A1 | 5/2012 | Morton et al. |
| 2012/0155580 A1 | 6/2012 | Wang et al. |
| 2012/0213531 A1 | 8/2012 | Nazarathy et al. |
| 2013/0214952 A1 | 8/2013 | Makinwa et al. |
| 2013/0259178 A1 | 10/2013 | Bae et al. |
| 2013/0293361 A1 | 11/2013 | Posa et al. |
| 2013/0300470 A1 | 11/2013 | Mohajeri et al. |
| 2013/0332968 A1 | 12/2013 | Anandakumar et al. |
| 2014/0056099 A1 | 2/2014 | Hancock |
| 2014/0169501 A1 | 6/2014 | Nazarathy et al. |
| 2014/0185736 A1 | 7/2014 | Chandrashekar et al. |
| 2014/0211779 A1 | 7/2014 | Caire et al. |
| 2014/0268111 A1 | 9/2014 | Couch et al. |
| 2014/0292388 A1 | 10/2014 | Mohajeri et al. |
| 2014/0348217 A1 | 11/2014 | Hsieh et al. |
| 2015/0084676 A1 | 3/2015 | McLaurin et al. |
| 2015/0124861 A1 | 5/2015 | Bae et al. |
| 2015/0156558 A1 | 6/2015 | Anandakumar et al. |
| 2015/0263742 A1 | 9/2015 | McLaurin et al. |
| 2015/0311908 A1 | 10/2015 | Laaja et al. |

(56) References Cited

U.S. PATENT DOCUMENTS

2016/0087824 A1     3/2016   Makinwa et al.
2016/0099720 A1     4/2016   Bashir et al.
2016/0153864 A1     6/2016   Couch et al.

\* cited by examiner

SUPERCONDUCTING DIGITAL PHASE ROTATOR

CROSS REFERENCE TO RELATED APPLICATIONS

The present application is a Continuation of U.S. patent application Ser. No. 14/743,409, filed Jun. 18, 2015, now U.S. Pat. No. 9,334,069, issued May 17, 2016, which is a Continuation of U.S. patent application Ser. No. 13/073,942, filed Mar. 28, 2011, now U.S. Pat. No. 9,065,452, issued Jun. 23, 2015, which is a Continuation of U.S. patent application Ser. No. 11/625,013, filed Jan. 19, 2007, now U.S. Pat. No. 7,917,798, issued Mar. 29, 2011, which is a Continuation-in-Part of U.S. application Ser. No. 11/617,806, filed Dec. 29, 2006, and claims priority under 35 U.S.C. §119(e) to Provisional Patent Application No. 60/840,379, filed Aug. 25, 2006, each of which is incorporated herein by reference in its entirety.

This application is related to (but does not claim priority from) U.S. application Ser. No. 11/243,020, filed Oct. 5, 2005, now U.S. Pat. No. 7,508,230, issued Apr. 5, 2007, entitled "A Digital Programmable Phase Generator", the contents of which is incorporated herein by reference in its entirety.

STATEMENT REGARDING FEDERALLY FUNDED RESEARCH

This invention was made with government support under W15P7T-040C-K403 awarded by U.S. Army. The government has certain rights in the invention.

BACKGROUND OF THE INVENTION

Field of the Invention

The field of the invention relates to superconducting digital integrated circuits and, more particularly, to a digital phase rotator which permits phase shifts in a positive and negative direction.

Description of the Prior Art

High-speed digital circuits are generally synchronous, with a periodic clock signal distributed throughout the circuit. In some systems, a multi-phase clock signal may be used, with two or more clock signals distributed in parallel. A two-phase clock may have one clock signal delayed one-half a clock period with respect to the second clock signal. Furthermore, it may be desirable in some cases to adjust the phase delay of one or more clock signals, relative to a reference clock. For example, one may want to synchronize an internal clock to that in an external signal, for a clock recovery circuit. In this case, one would want a highly precise adjustment, but this adjustment would likely be much slower than the clock frequency. A circuit optimized for this purpose is often called a phase-delay generator or simply a phase generator.

Alternatively, one might want to design a broadband phase modulator, where the clock phase needs to be adjusted quite rapidly. This type of circuit might be called a phase rotator (or sometimes a phase interpolator). A generic phase rotator or phase generator can be represented by the same block diagram of FIG. 1. This shows a master clock input, one or more phase-shifted clock outputs, and a control input. The control input may in general be an analog signal, but the focus of the invention described herein is on a digital control input signal. Both phase generators and phase rotators have been developed in standard semiconductor circuit technologies, and are examples of the prior art.

It is understood within this application and to one skilled in the art, that the term "clock" or "clock signal" refers to a generally periodic sequence of pulses. Such a pulse train may have a broader range of applications than strictly serving as a clock in a synchronized circuit. For example, a pulse train can serve as a carrier in a digital modulation scheme. Within this application, "clock" does not restrict possible applications of a phase rotator or related circuits.

Ultrafast superconducting digital circuits are based on Josephson junctions integrated together according to RSFQ Logic (Rapid-single-flux-quantum), first proposed by K. Likharev and V. Semenov (1991). Multi-GHz clock rates are routine in this technology, with rates of 100 GHz or higher possible. These very high speeds enable precision timing circuits. Earlier fast timing circuits include a time-to-digital converter (A. Kirichenko, et al., "RSFQ Time Digitizing System", IEEE Trans. Appl. Supercond., vol. 1, 2001, pp. 978-981.), and a digital programmable phase generator (A. Kirichenko, S. Sarwana, D. Gupta and D. Yohannes, "Superconductor Digital Receiver Components", IEEE Trans. Appl. Supercond., Vol. 15, No. 2, June 2005, pp. 249-254.). One key circuit element of these devices is an RSFQ toggle-flip-flop or TFF, which can direct input pulses alternately to one or the other of two complementary outputs. TFFs are primary elements of binary frequency dividers and binary counters. Superconducting TFFs have been measured to operate at frequencies in excess of 700 GHz.

The digital programmable phase generator shown in application Ser. No. 11/243,020 is shown in FIG. 2. This follows the model of FIG. 1, with a high-frequency clock input, a decimated clock output, and a set of digital input bits that determine the delay of the output. This is comprised of an alternating chain of m TFFs and m−1 inverters, with the decimated clock a factor of $2^m$ slower than that of the master clock on the left. Further, if the m−1 control inputs represent the bits of a binary number N (the most significant bit is on the right), then the phase delay at the output is given by $360° \times N/2^m$.

RSFQ circuits also are high-precision data converters, based on the fact that a voltage-biased Josephson junction generates a series of single-flux-quantum (SFQ) voltage pulses, each with integrated voltage equal to the flux quantum $\Phi_0 = h/2e = 2.07$ mV-ps. This quantum linearity has enabled superconducting analog-to-digital converters (ADCs) that can directly digitize radio-frequency signals as shown in (O. Mukhanov, et al., "Superconducting Analog-to-Digital Converters", Proceedings of the IEEE, vol. 92, 2004, pp. 1564-1584). One type of superconducting ADC is known as the phase-modulation ADC, in which the analog input signal is encoded in the modulated timing of a fast SFQ pulse train. Similarly, direct digital synthesis of RF signals (essentially an RF digital-to-analog converter or DAC) can be obtained by precise digital generation of properly timed SFQ pulse trains. For this purpose, a fast superconducting digital phase modulator is required.

The prior art lacked a superconducting phase rotator, which allows phase to be adjusted in both positive and a negative direction. Further, this needs to be done at an ultra-fast rate utilizing RSFQ logic.

SUMMARY OF THE INVENTION

The invention described herein overcomes the problems of the prior art. The present invention describes a fast digital phase rotator circuit, where a multi-phase clock signal can be phase-shifted at multi-GHz rates. Preferred implementations of this circuit are shown in FIGS. 3A-3D, where the circuit is comprised of superconducting RSFQ elements, including TFFs, Confluence Buffers (CBs), inverters, and a latch. In contrast to the prior-art circuit of FIG. 2, either a phase delay (decrement) or a phase advance (increment) can be synthesized. This example is designed for a master clock of 32 GHz, and a decimated output clock of 2 GHz. Also unlike the circuit of FIG. 2, FIG. 3C is designed for a 4-phase clock. The clock ratio and numbers of output phases may be easily modified by changing the number and configuration of TFF stages.

For the specific example shown in FIG. 3D, FIG. 7 shows the relative phase angles of each of the 4 clock outputs. There are four equal-weighted 1-bit input lines, two for a phase delay (decrement) and two for a phase advance (increment). A digital input on either increment line will advance the phase by one fine unit (360°/16=22.5°); input on both INC lines will advance the phase by two units, and similarly in the reverse direction for the DEC lines. Taking all 4 outputs together, the entire phase range is covered, with a precision of 1/16th. This is not ultra-high precision, but the circuit is optimized for speed. The phase may be modulated at a rate of 2 GHz, the same rate as the output clock. This is why this circuit is appropriate as a digital phase modulator for a fast DAC. Such a phase rotator with multiple clock phases may also have application in generating a specially shaped output pulse, for equalization of high-speed digital amplifiers.

In another specific example shown in FIG. 3B, a plurality of simple phase rotators of FIG. 3A are cascaded together in a way that can achieve additional precision. For an m-stage phase rotator with a pair of m-bit binary-weighted control inputs INC and DEC, a precision to one part in $2^m$ can be obtained. For large m, arbitrary precision can be achieved.

BRIEF DESCRIPTION OF THE DRAWINGS

The invention will be described with reference to the following drawings, in which.

DETAILED DESCRIPTION OF THE INVENTION

Figure 1:
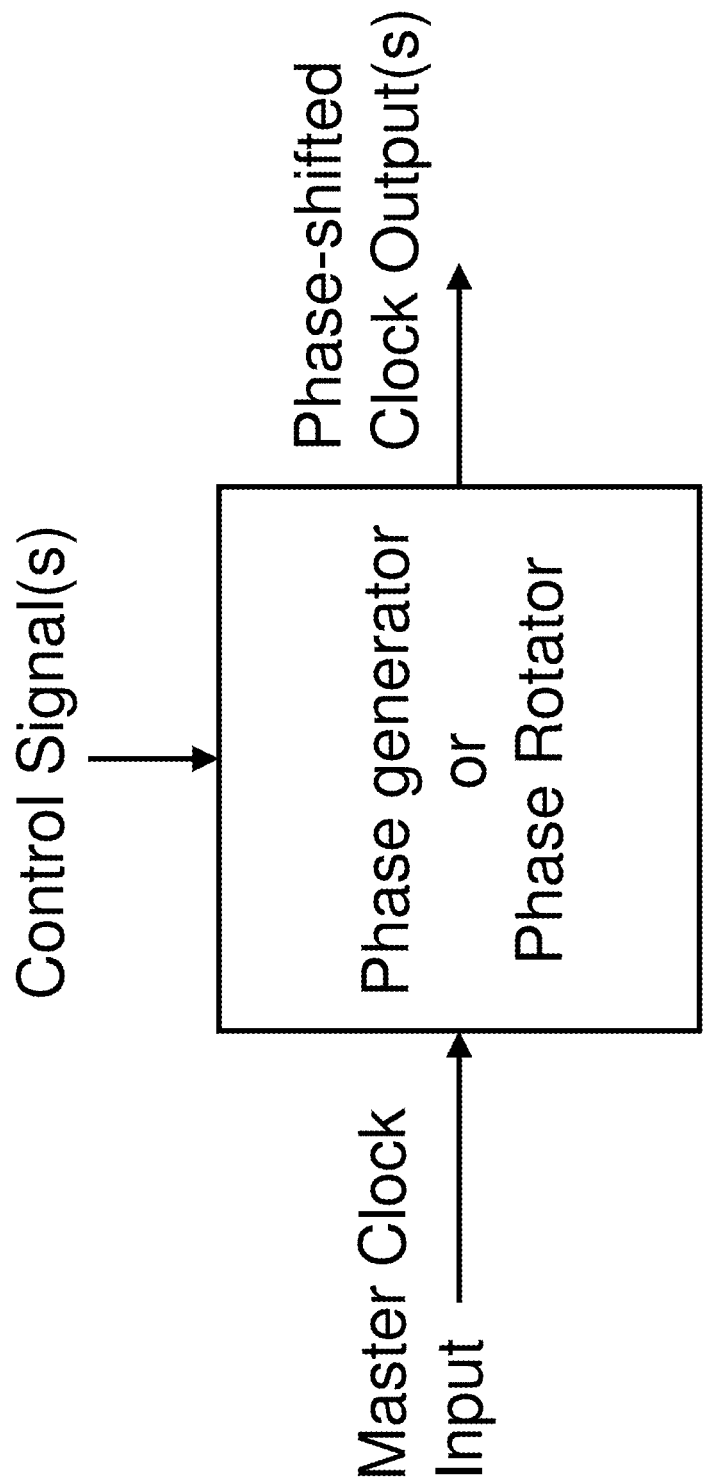
FIG. 1 is a block diagram of a generic phase rotator.

As discussed in the background of the invention, FIG. 1 shows a block diagram of a generic phase rotator or phase generator that has a master clock input, one or more phase-shifted clock outputs, and a control input. The control input may in general be an analog signal but the focus of this invention is on a digital control input signal.

Figure 2:
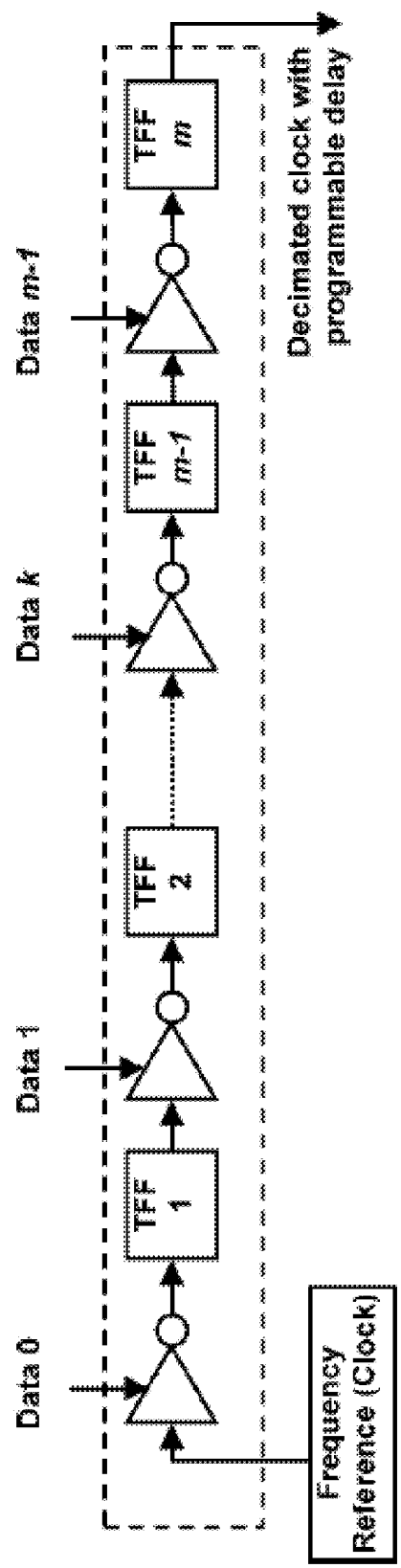
FIG. 2 is a block diagram of a digital programmable phase generator as shown in U.S. patent application Ser. No. 11/243,020.

The digital programmable phase generator of Kirichenko is described in pending patent application Ser. No. 11/243,020. As shown in FIG. 2, the phase generator of Kirichenko was able to adjust phase only in a single direction and therefore lacked the flexibility of the present invention.

Figure 3A:
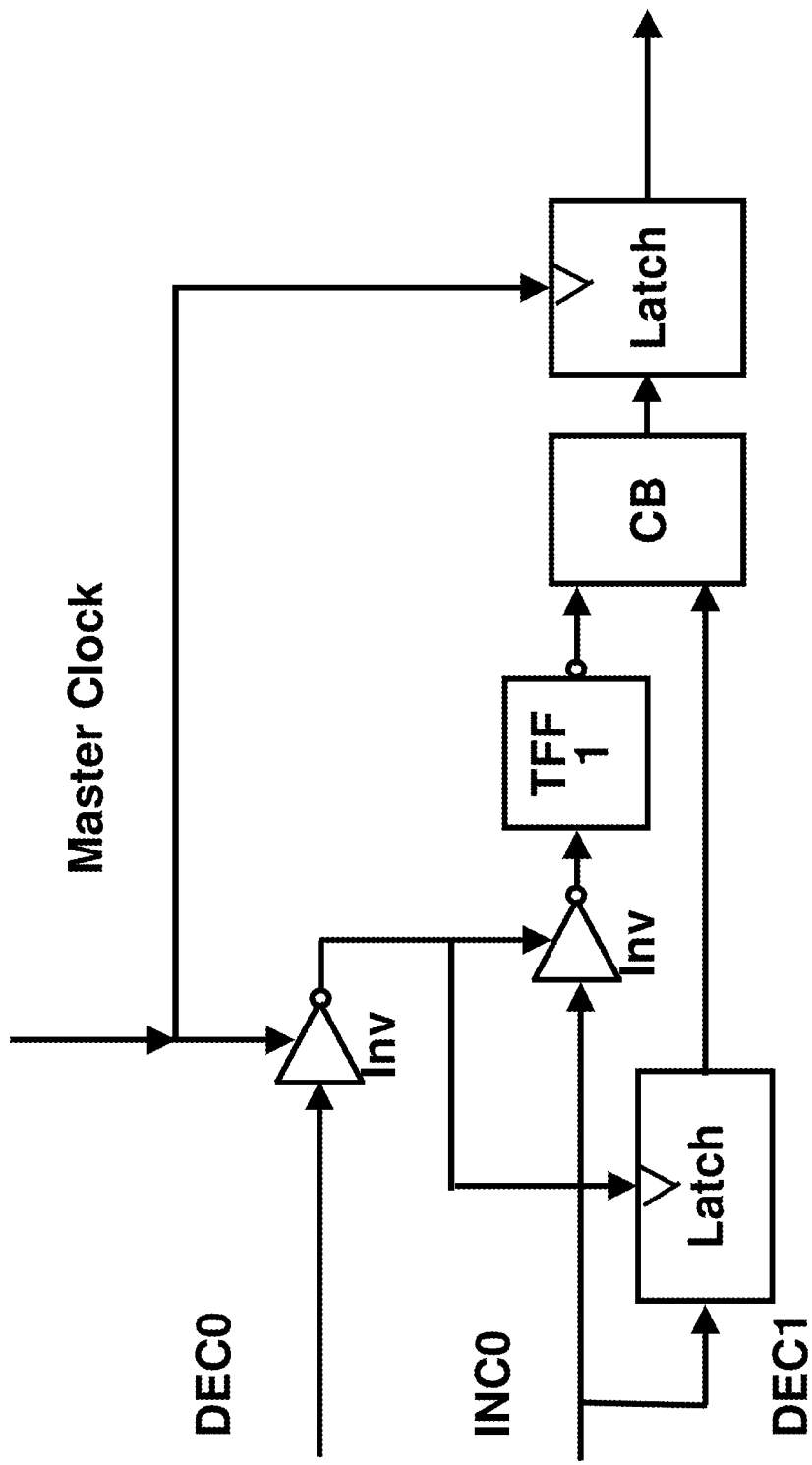
FIG. 3A is a block diagram of a phase rotator with bipolar single-bit control inputs, in accordance with one aspect of the invention.

FIG. 3A is a block diagram of a phase rotator in accordance with one aspect of the invention with one control bit being a decrement input (DEC0) and one bit being an increment input (INC0). The circuit comprises an inverter, toggle flip-flop (TFF), confluence buffer (CB) and latches. A decrement input (DEC0) causes the inverter to delay one pulse interval, retarding the timing of the pulse stream by one master clock period. Similarly an increment (INC0) input bypasses the first TFF to advance the timing of the output pulse stream by one clock period. Thus depending on the control inputs, the phase of the output pulse stream can be shifted by one clock period in any direction. The master clock is applied to a first inverter which is also connected to the DEC0 line. When a DEC0 pulse is present, the output of the inverter is stopped for the interval of a pulse and the decremented clock is then passed to a second inverter connected to the INC0 line. With no INC0 or DEC0 pulses present, the master clock will pass through the inverters without change. When the INC0 pulse is present on the inverter connected to the INC0 line, the bypass line connected to the INC0 line and connecting to the a confluence buffer (CB) as shown will advance the timing of the output pulse stream by one master clock period. Thus, the DEC0 pulse will delay a pulse from the master clock train applied through the TFF to CB and the latch by one clock period and the INC0 pulse will advance the timing of the output pulse train by one clock period. The latch is a type D flip-flop which insures that the pulses generated are synchronized to the master clock. In the preferred embodiment shown in FIG. 3A, a similar clocked latch is included in the bypass line that leads from the INC0 line to the CB. where the clock input to this clocked latch may be provided by the output of the first inverter.

Figure 3B:
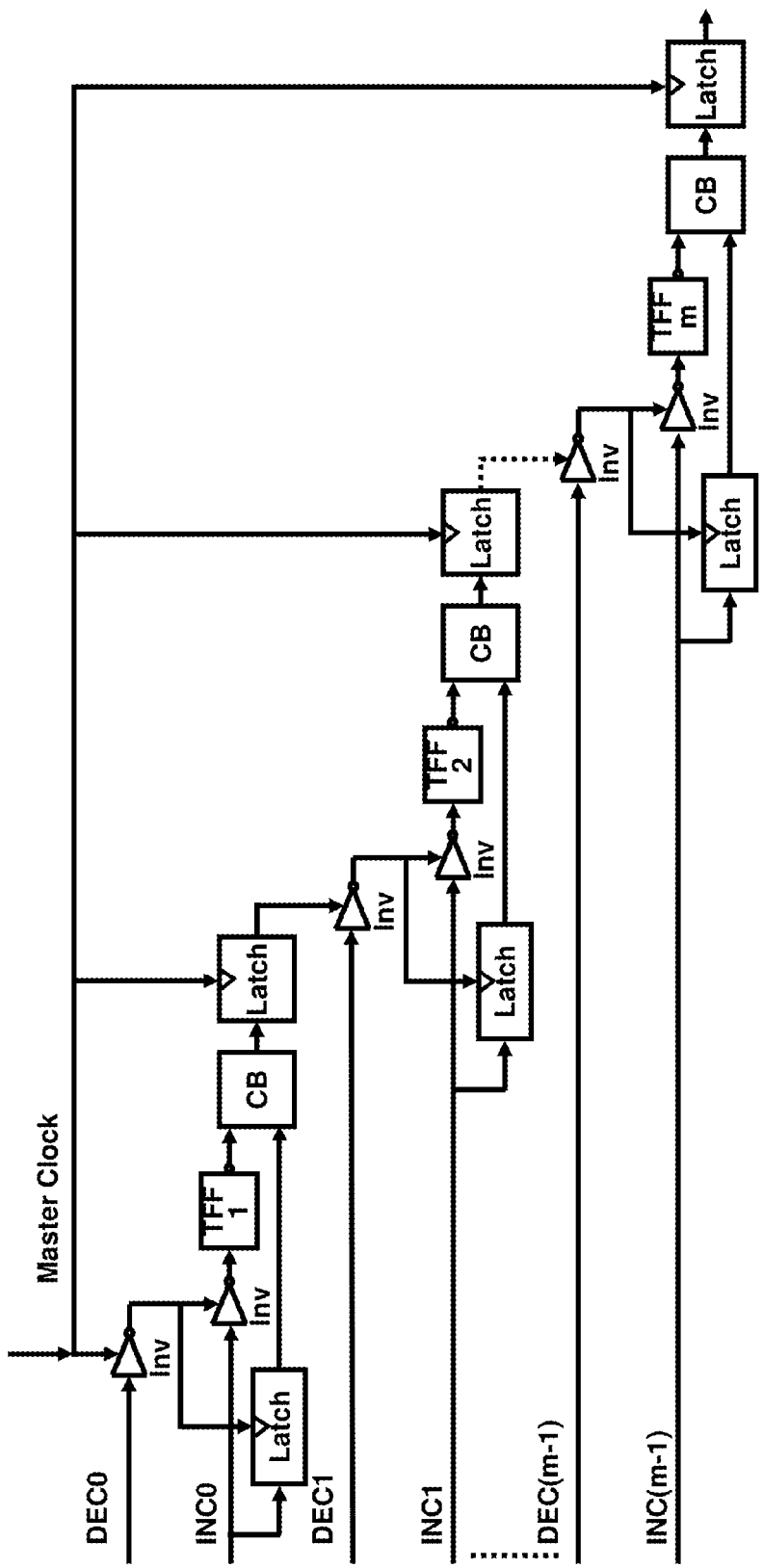
FIG. 3B is a block diagram of a phase rotator that cascades a plurality of bipolar single bit phase rotators, to form a multi-bit phase rotator with a binary-weighted control input.

FIG. 3B is a block diagram of a phase rotator that cascades a plurality of single bit phase rotators, such as shown in FIG. 3A to form a multi-bit phase rotator. Two multi-bit binary-weighted words $INC_i$ and $DEC_i$ serve as digital input words specifying the amount of phase shift increment or decrement respectively. In presence of both (m-bit increment and m-bit decrement) inputs, the resultant shift in phase corresponds to the difference between the increment and decrement number. Thus, $N=N_{INC}-N_{DEC}$. The bits of each digital word in FIG. 3B are related to the other as bits of a binary word that represent a number, whereas, in FIG. 3A and FIG. 3C the bits represent equal-weighted contributions to increment or decrement. Thus, by sending an m-bit binary number N to the control input of the phase rotator, we achieve a phase shift the output signal by $2\pi N2^{-m}$ in any direction. One advantage of this generalized m-bit input is that the phase rotator can be made arbitrarily precise, if m is large enough.

Figure 3C:
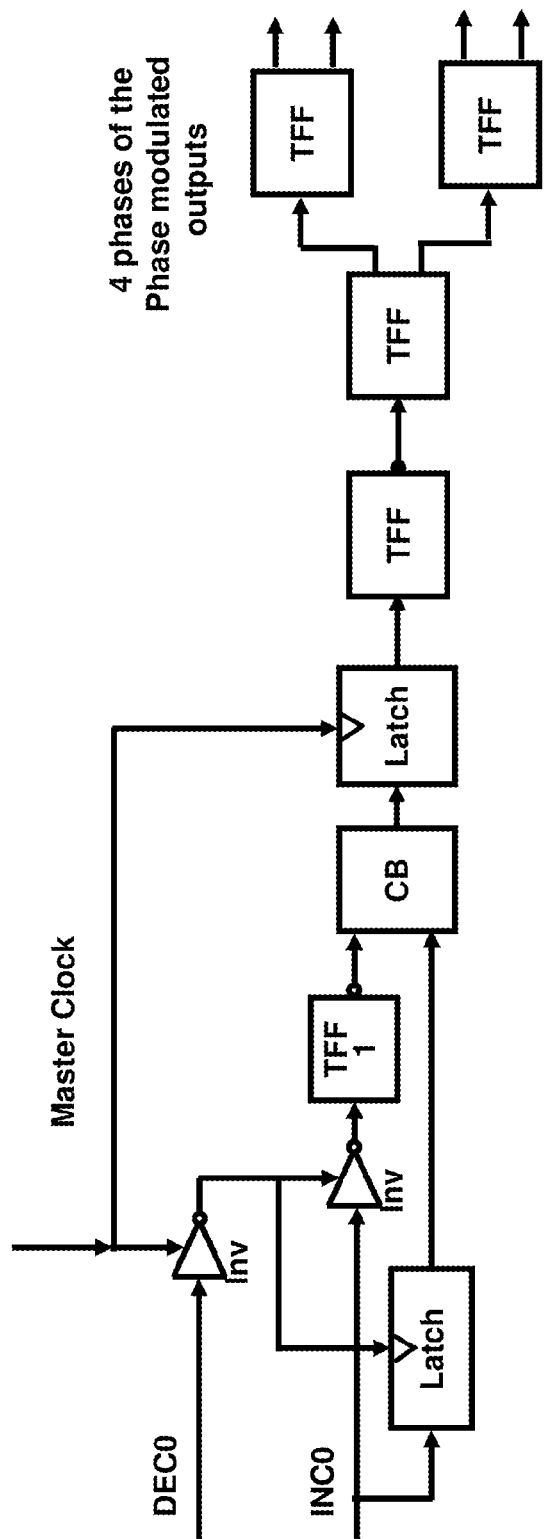
FIG. 3C is a block diagram of a phase rotator of FIG. 3A followed by a frequency divider.

FIG. 3C is a block diagram of a one bit phase rotator of FIG. 3A followed by a frequency divider to generate multiple phases of the output. The number of TFFs in the frequency chain depends on the required output frequency. In the absence of increment or decrement input, the circuit decimates the master clock by a factor of $2^m$, where m is a number of TFFs.

Figure 3D:
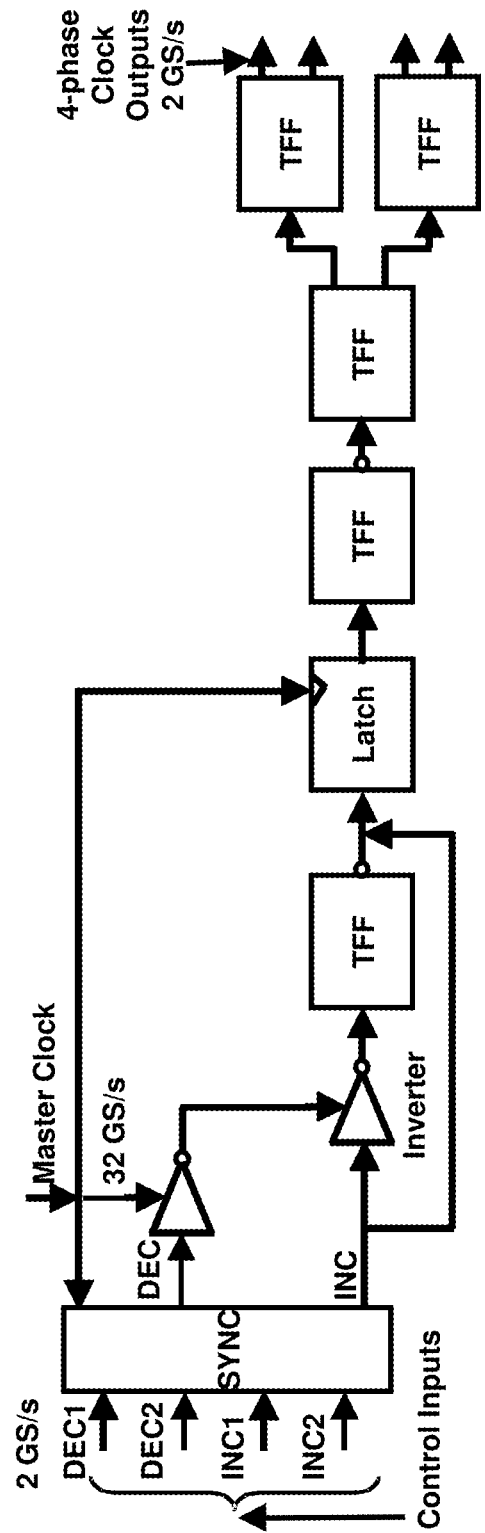
FIG. 3D is a block diagram of a phase rotator with a synchronizer front end to combine four equal-weighted control bits onto two bipolar control lines.

FIG. 3D is a block diagram of a phase rotator with a synchronizer-multiplexer front end. Four control inputs, namely DEC1, DEC2, INC1 and INC2 serve to control the phase shift. These inputs are applied to the synchronizing block SYNC which also receives an input from the master clock. The SYNC block will be described more hereinafter in conjunction with FIG. 4. Two outputs, a DEC output and an INC output, serve to cause an incrementing of the clock or a decrementing of the clock as discussed more hereinafter. The master clock is applied to an inverter which is also connected to the DEC line. When a DEC pulse is present, the output of the inverter is stopped for a pulse interval (master clock period) and the decremented clock is then passed to an inverter connected to the INC line. With no INC or DEC pulses present, the master clock will pass through the inverters without change. When the INC pulse is present on the inverter connected to the INC line, the bypass line connected to the INC line and connecting to the confluence buffer (CB) as shown will advance a pulse into the output pulse train. Thus, the DEC pulse will effectively delay a pulse from the master clock train applied through the TFF to the latch and the INC pulse will advance a pulse in that pulse train. The latch is a type D flip-flop which insures that the pulses generated are synchronized to the master clock.

The circuit of FIG. 3D is designed for 4 parallel one bit inputs, two each for increment and decrement. The two INC inputs have equal weights, which differs from a 2-binary-bit INC input (as in FIG. 3B) where the most significant bit (MSB) would have twice the weight of the least significant bit (LSB).

Note that in the example in FIG. 3D, the master clock operates at 32 GigaSamples per seconds (GS/s). The 32 GS/s clock is applied to a first toggle flip-flop (TFF) which divides a clock rate down to 16 GS/s. The first TFF after the latch, divides the master clock down to 8 GS/s and the subsequent TFF divides it down to 4 GS/s. The 4 GS/s outputs are applied to respected toggle flip-flops which are fed by regular and inverted outputs from the 4 GS/s TFF, thus producing four output phases at 2 GS/s each with each of the phases from a particular output TFF being in quadrature relationship.

Figure 4:
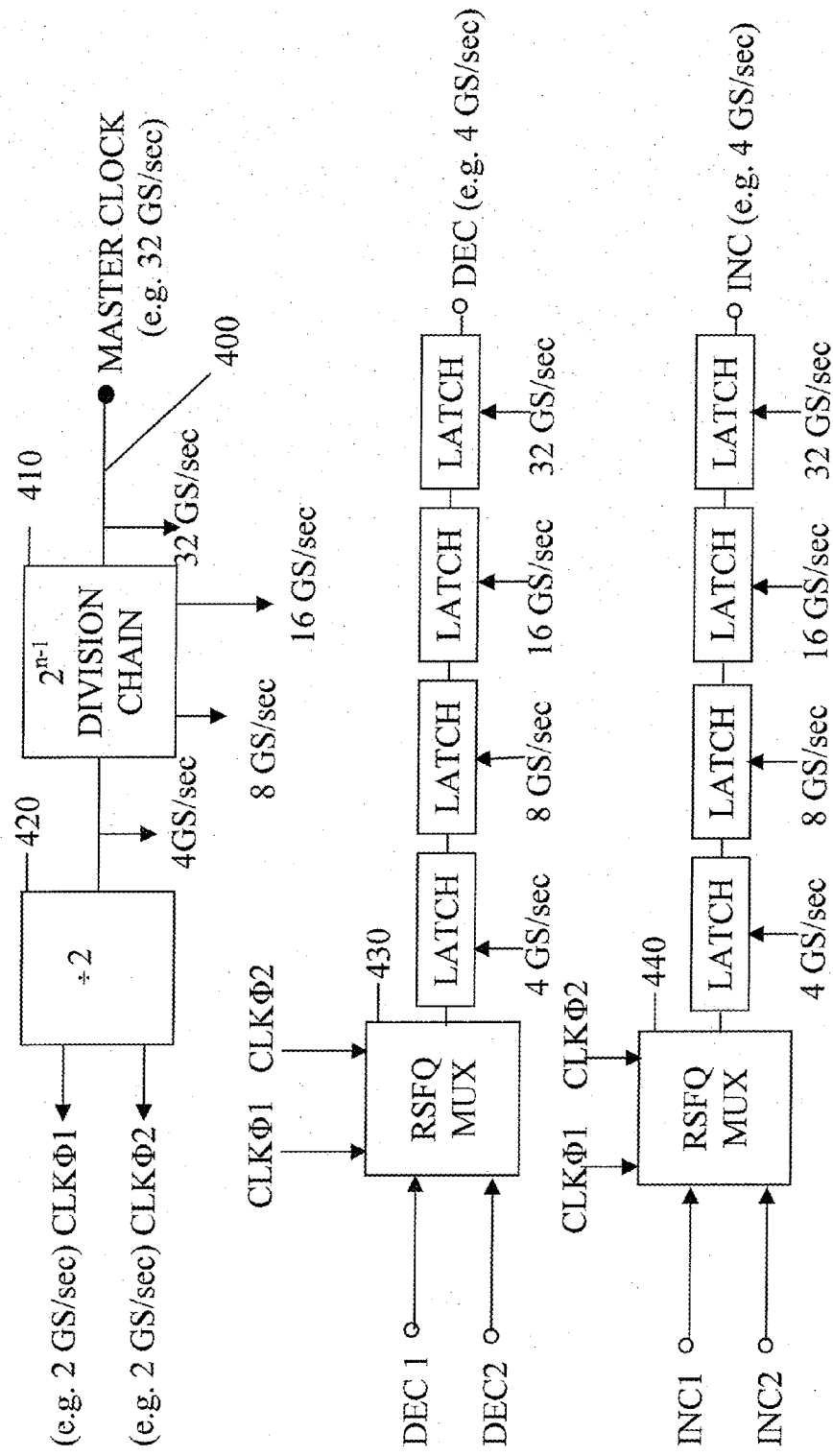
FIG. 4 is a block diagram of an exemplary synchronizing block shown in FIG. 3D.
Figure 5:
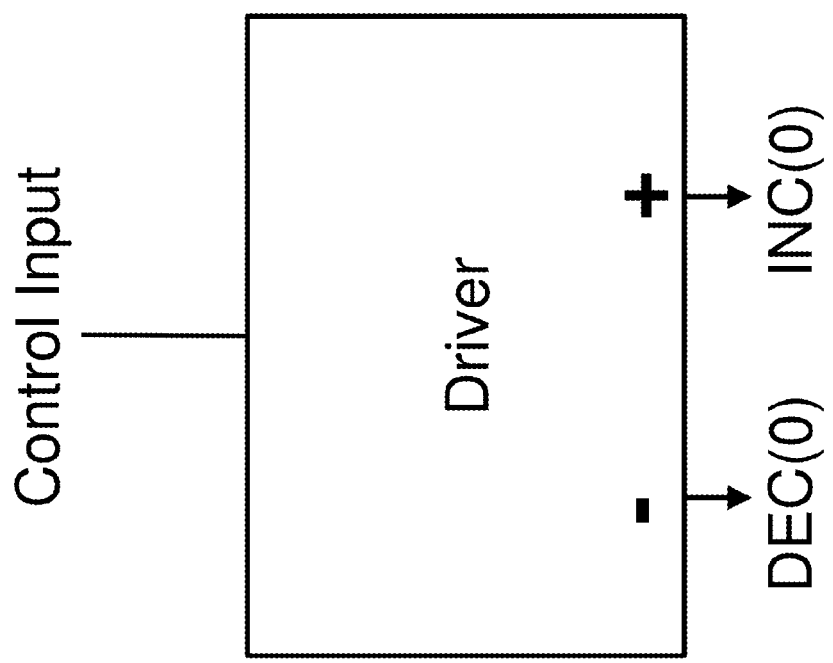
FIG. 5 is a block diagram of an example of a circuit for generating the control signals of FIG. 3.

FIG. 4 is a block diagram of an exemplary synchronizing block SYNC shown in FIG. 3. A synchronizer block is optional, but does make the phase rotator work better by reducing phase jitter. A master clock input 400 (e.g. operating at 32 GS/s) feeds a chain of dividers 410 and 420, producing clock signals at 32 GS/sec, 16 GS/sec, 8 GS/sec and 4 GS/sec. The last stage of the divider chain 420 produces regular and inverted outputs CLKϕ1 and CLKϕ2 each operating at 2 GS/s. In the example shown, the clocks CLKϕ1 and CLKϕ2 are applied to RSFQ multiplexers 430 and 440. The inputs DEC1 and DEC2 are alternatively selected by the multiplexer and applied to the output line DEC. Similarly, input lines INC1 and INC2 are multiplexed and applied sequentially to the output line INC. The DEC and the INC lines each have an output rate, in this example, at 4 GS/s. A series of latches 450$i$ and 450$j$ receive the output of the multiplexer 430 and 440 respectively. These latches serve to synchronize the phase transitions of the multiplexer outputs to the 4 GS/sec, the 8 GS/sec, 16 GS/sec and 32 GS/sec clock signals produced by the chain of dividers.

The multiplexing circuits discussed in conjunction with FIG. 4 operate differently from the confluence buffers of other figures. A confluence buffer (CB) merges two input pulse streams into a single output pulse stream. A confluence buffer has no protection for the case where two pulses come in at the same time—one of the two will be lost. In contrast, a proper multiplexer (MUX) provides for interleaving two input pulse streams together, using a two phase clock and latches to make sure that no pulses get lost. This is more complicated than a CB, but it is still a standard RSFQ circuit that is not the subject of the present invention.

The particular type of driver utilized depends upon the type of control input signal. If the input were analog, the driver could constitute a $\Delta/\Sigma$ modulator that applies increment and decrement pulses in response to changes in the input signal. If the control input were a digital input, the INC and DEC pulses could represent whether or not the state of the control input is above or below a threshold level for the digital control input word. The particular type of driver is not important. Rather, the type of driver will vary depending upon the particular application to which the phase rotator is put. The INC and DEC inputs can be simply digital signals generated by a digital signal processor. These INC and DEC inputs may be multi-bit, binary inputs, or else single-bit over-sampled inputs.

Figure 6:
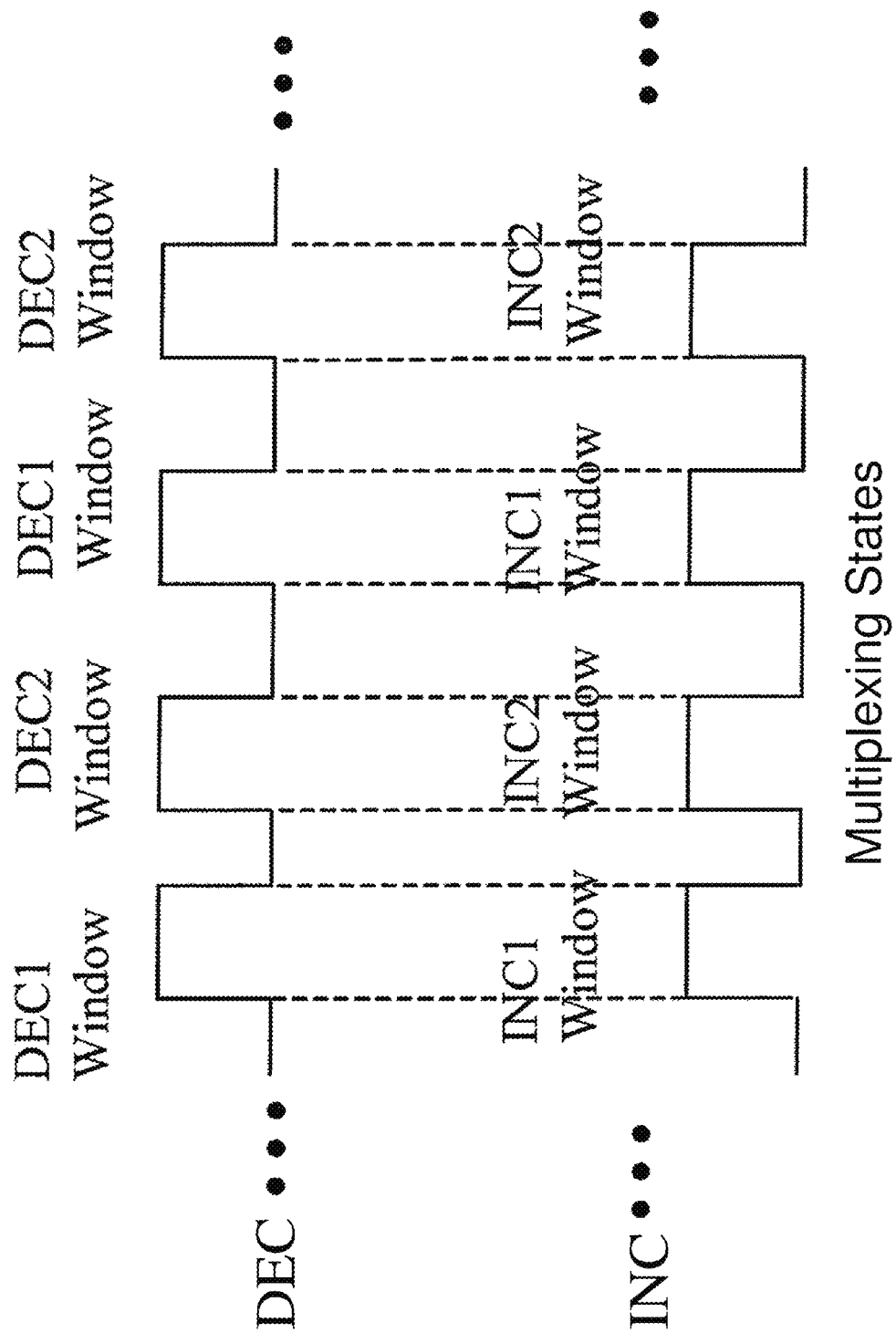
FIG. 6 is a timing diagram for illustrating the states of the multiplexers of FIG. 4.

FIG. 6 is a timing diagram illustrating the windows during which multiplexers of FIG. 4 permit RSFQ pulses from the various input lines of FIG. 3D, for example, to pass to respective output lines DEC and INC. The top timing line shows that the outputs of multiplexer 430 and 440 of FIG. 4, alternately produces windows during which an output signal corresponding to DEC1 and DEC2 can be applied to the DEC output in a repeated fashion. Similarly, the lower timeline labeled INC shows the output from multiplexer 430 and 440 of FIG. 4, which open windows that permit an alternating sequence of INC1 and INC2 signals to pass to the INC line output.

Figure 7:
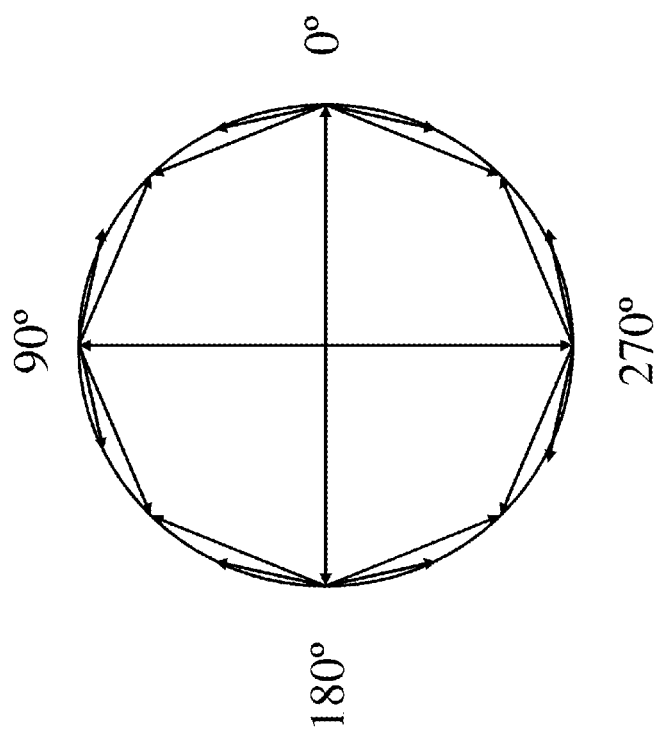
FIG. 7 is a diagram representing discrete values of four output clock phases available from the phase rotator of FIG. 3D.

FIG. 7 is a diagram representing discrete values of four output clock phases available from the phase rotator of FIG. 3D. For the specific example shown in FIG. 3D, FIG. 4 shows the relative phase angles of each of the 4 clock outputs. There are four 1-bit input lines, two for a phase delay (decrement) and two for a phase advance (increment). A digital input on either increment line will advance the phase by one fine unit (360°/16=22.5°); input on both INC lines will advance the phase by two units, and similarly in the reverse direction for the DEC lines. Taking all 4 outputs together, the entire phase range is covered, with a precision of 1/16th. This is not ultra-high precision, but the circuit is optimized for high speed. The phase may be modulated at a rate of 2 GHz, the same rate as the output clock. This is why this circuit is appropriate as a digital phase modulator for a fast DAC. Such a phase rotator with multiple clock phases may also have application in generating a specially shaped output pulse, for equalization of high-speed digital amplifiers.

Several examples of low-frequency test results for the circuit of FIG. 3D are shown in FIGS. 8-11.

Figure 8A:
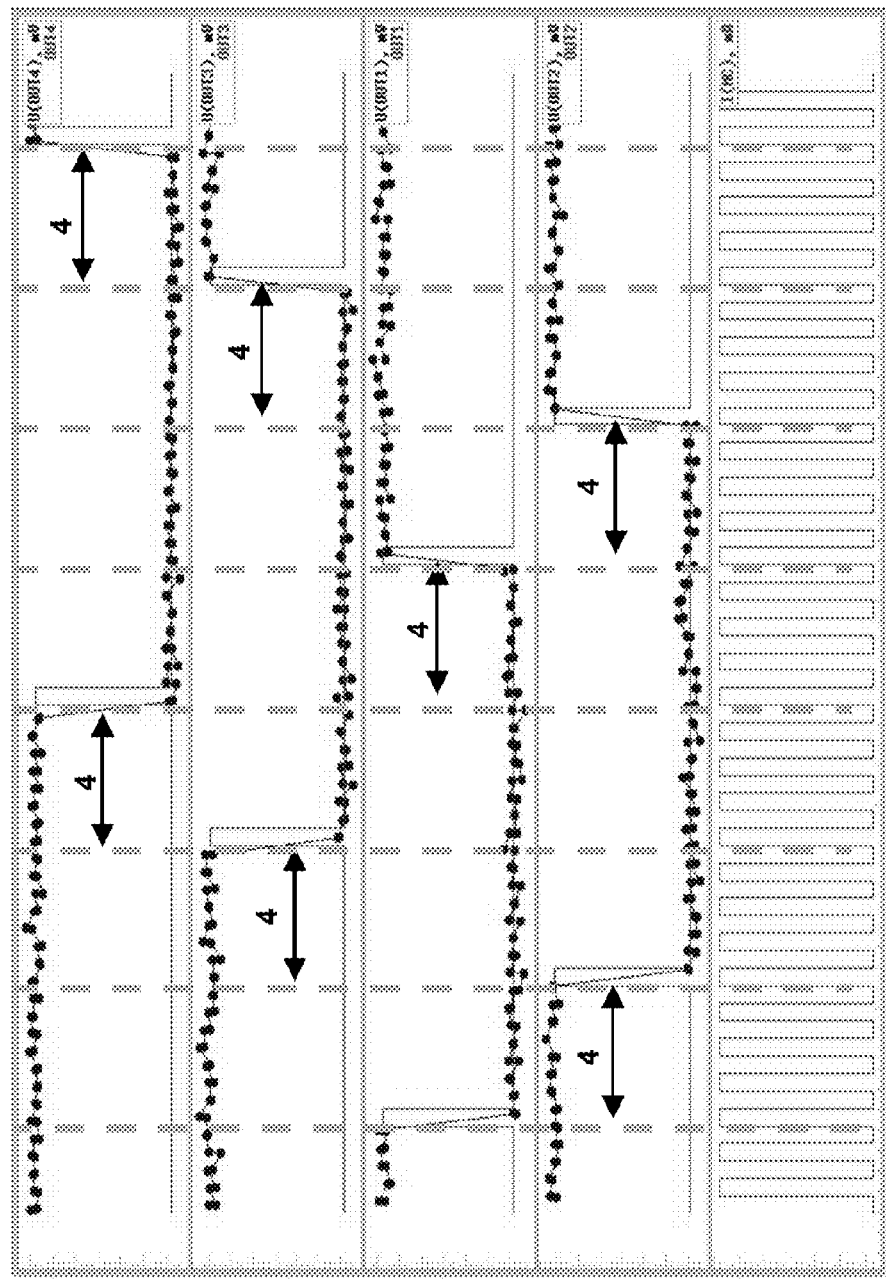
FIG. 8A is a graph showing test results from the phase rotator of FIG. 3D with no control inputs applied.

FIG. 8A is a graph showing test results from the phase rotator in FIG. 3D with no control inputs applied. Each output clock line generates an output pulse every 16 periods of the master clock. (The output amplifier toggles between voltage levels when an output pulse is generated.) The four clock phases are delayed by 4 master clock periods from each other, as expected.

Figure 8B:
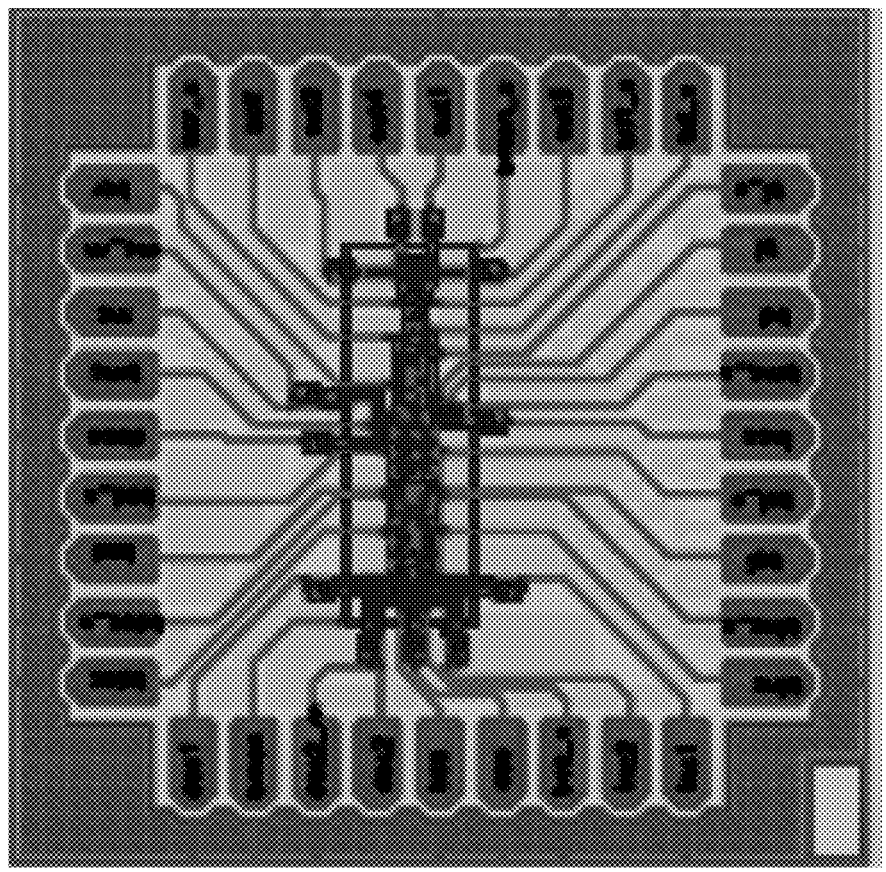
FIG. 8B is an exemplary layout of a phase rotator in accordance with one aspect of the invention.

FIG. 8B shows the chip layout of the entire phase rotator circuit of FIG. 3D, including input and output drivers, which was fabricated as a superconducting integrated circuit on a single 5 mm chip using fabrication technology of 3-µm Nb Josephson junctions with critical current density 1 kA/cm$^2$. It was tested in liquid helium at a temperature of 4.2 K, at low speed and at high speed.

Figure 9:
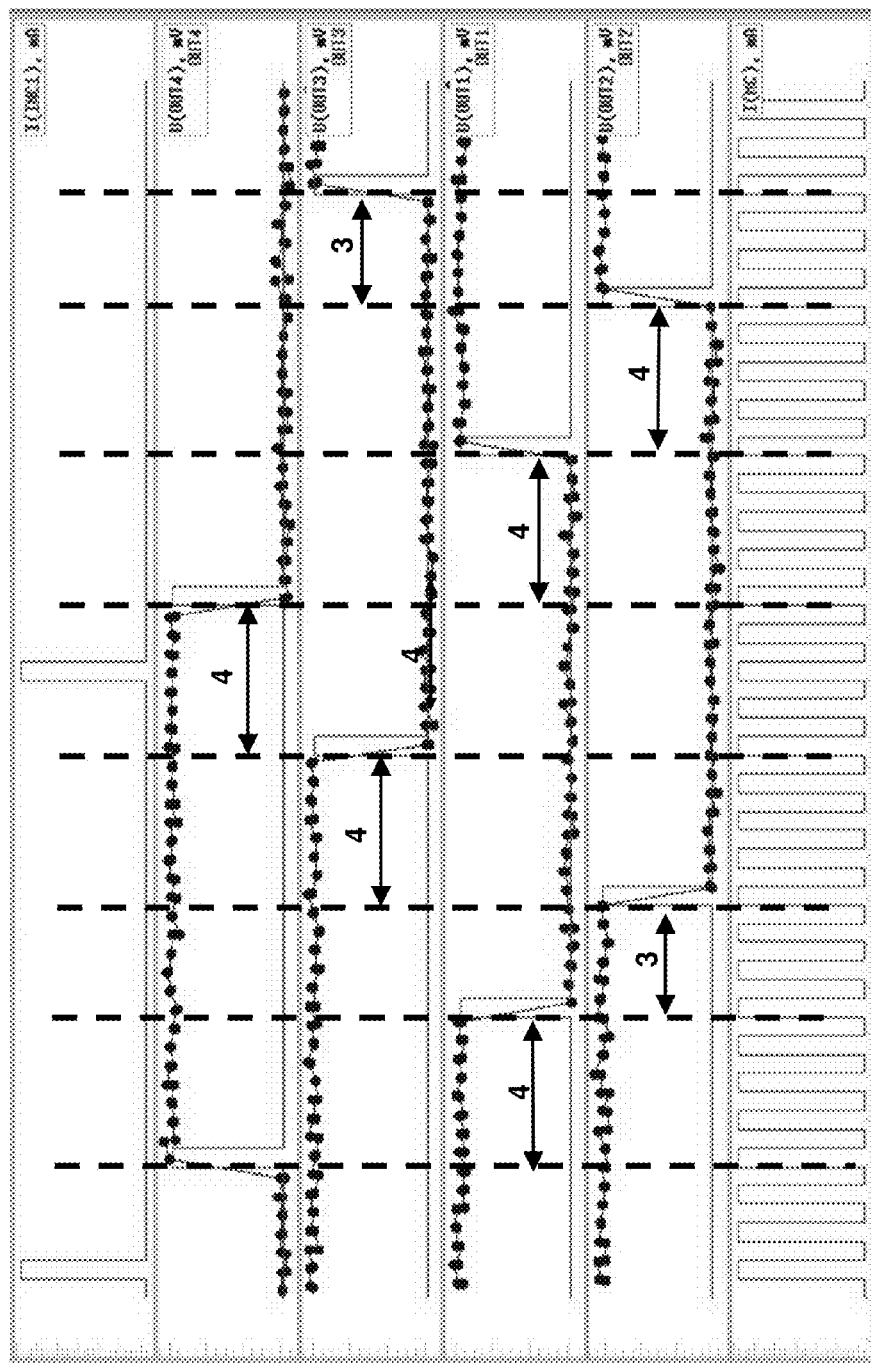
FIG. 9 is a graph showing test results from the phase rotator of FIG. 3D with an increment pulses applied at 1/16th of the clock frequency.

FIG. 9 shows the corresponding results with a control input on one of the increment (INC) inputs, at a rate of 1/16th of the master clock. As a result, the output clocks are advanced by 1 master clock period, in the appropriate locations.

Figure 10:
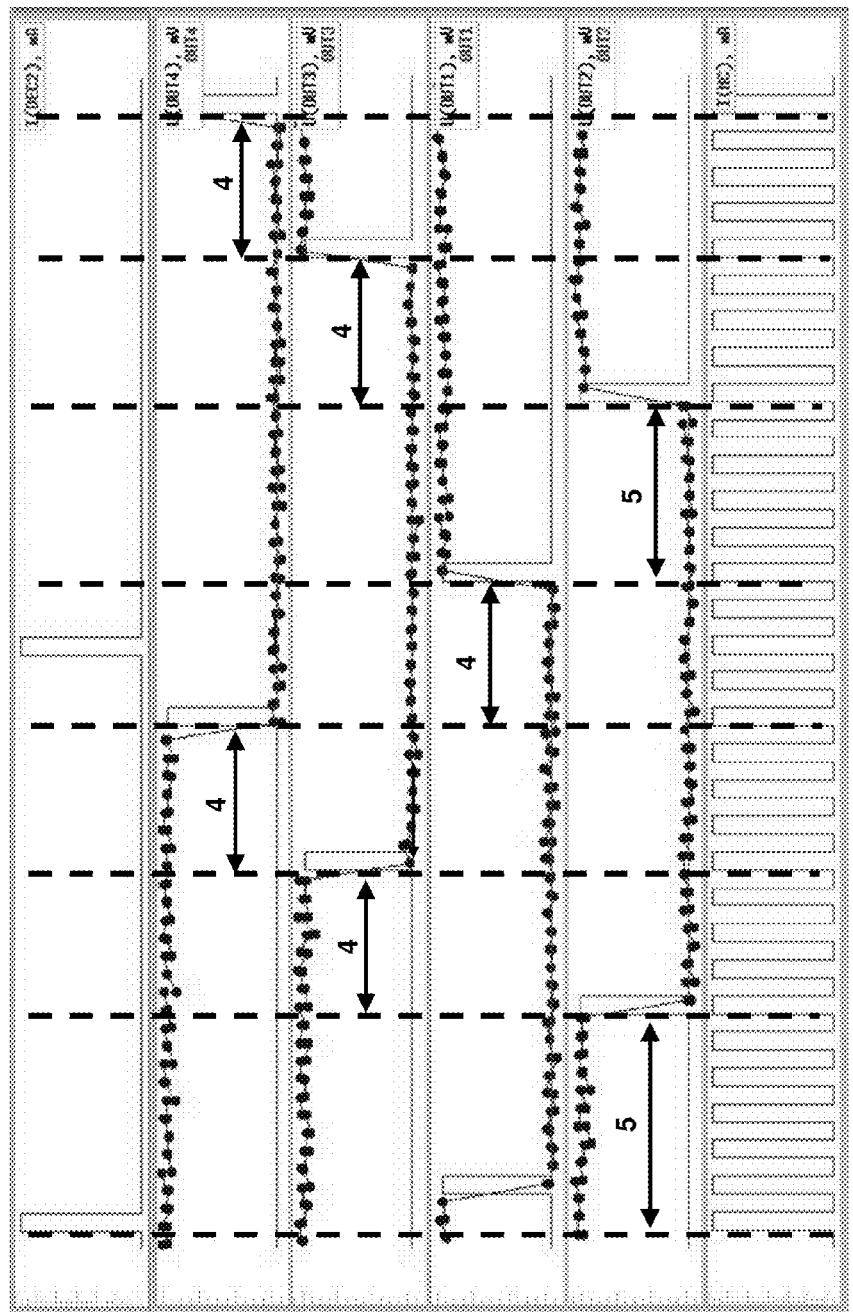
FIG. 10 is a graph showing test results from the phase rotator of FIG. 3D with decrement pulses applied at 1/16th of the clock frequency.

FIG. 10 shows the corresponding results for a control input pulse sequence on one of the decrement (DEC) lines, with the output clocks retarded by 1 master clock.

Figure 11A:
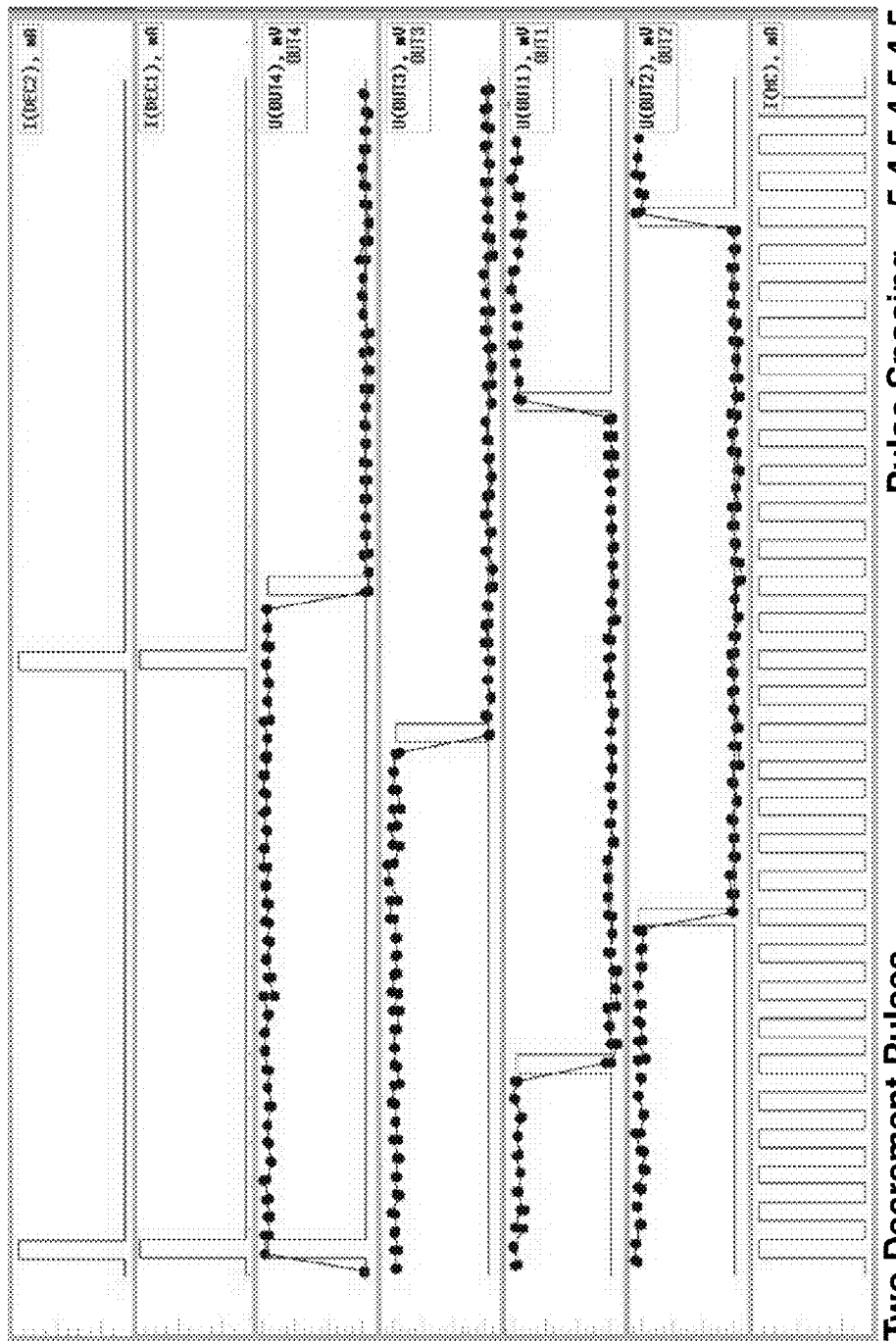
FIG. 11A is a graph showing test results from the phase rotator of FIG. 3D with two decrement pulses applied at 1/16th of the clock frequency.
Figure 11B:
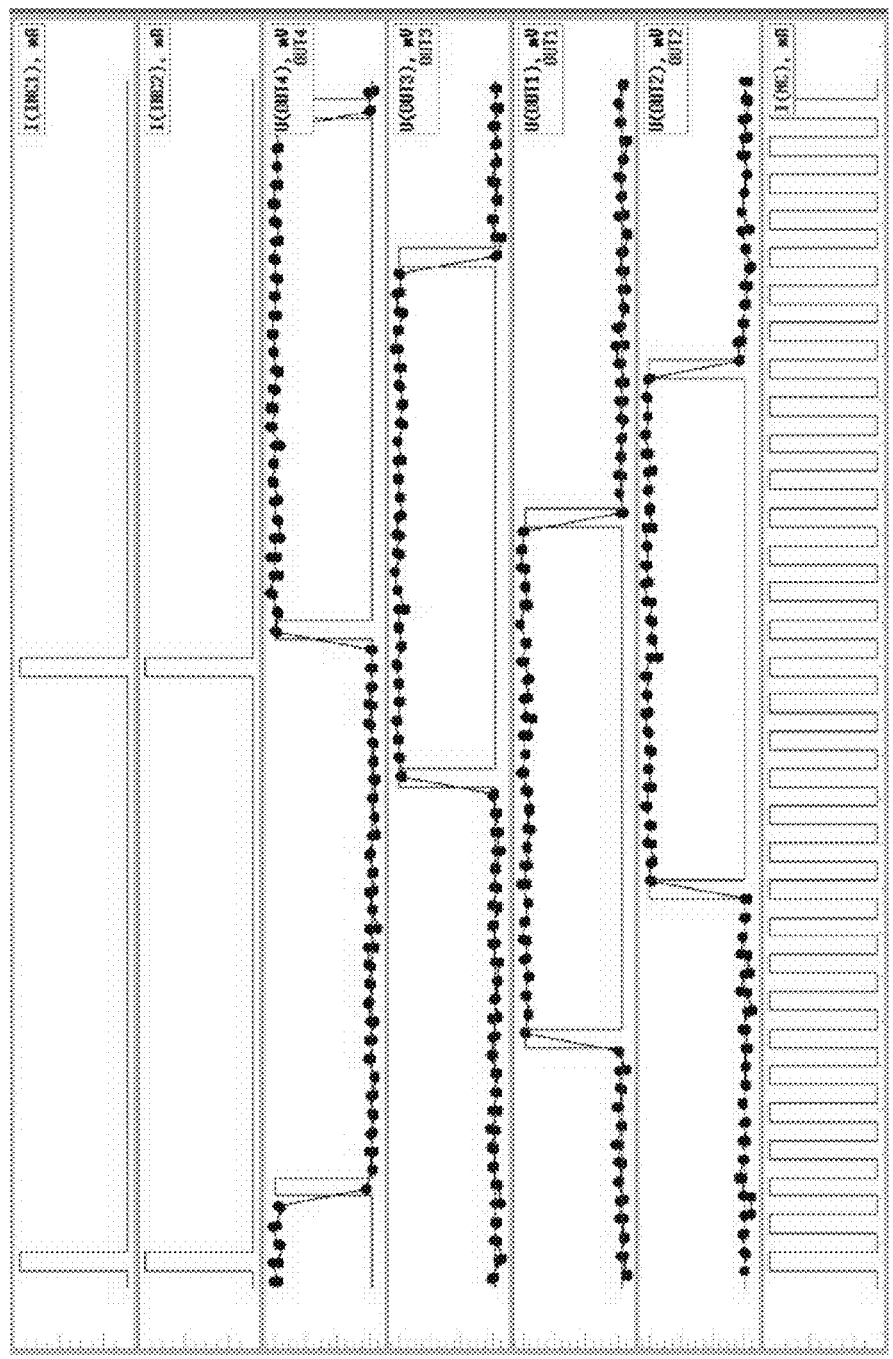
FIG. 11B is a graph showing test results from the phase rotator of FIG. 3D with two increment pulses applied at 1/16th of the clock frequency.

FIGS. 11A and 11B show the corresponding results for inputs on either 2 DEC lines or 2 INC lines. Note that INC and DEC pulses applied simultaneously cancel each other out, producing no net phase shift.

Figure 12A:
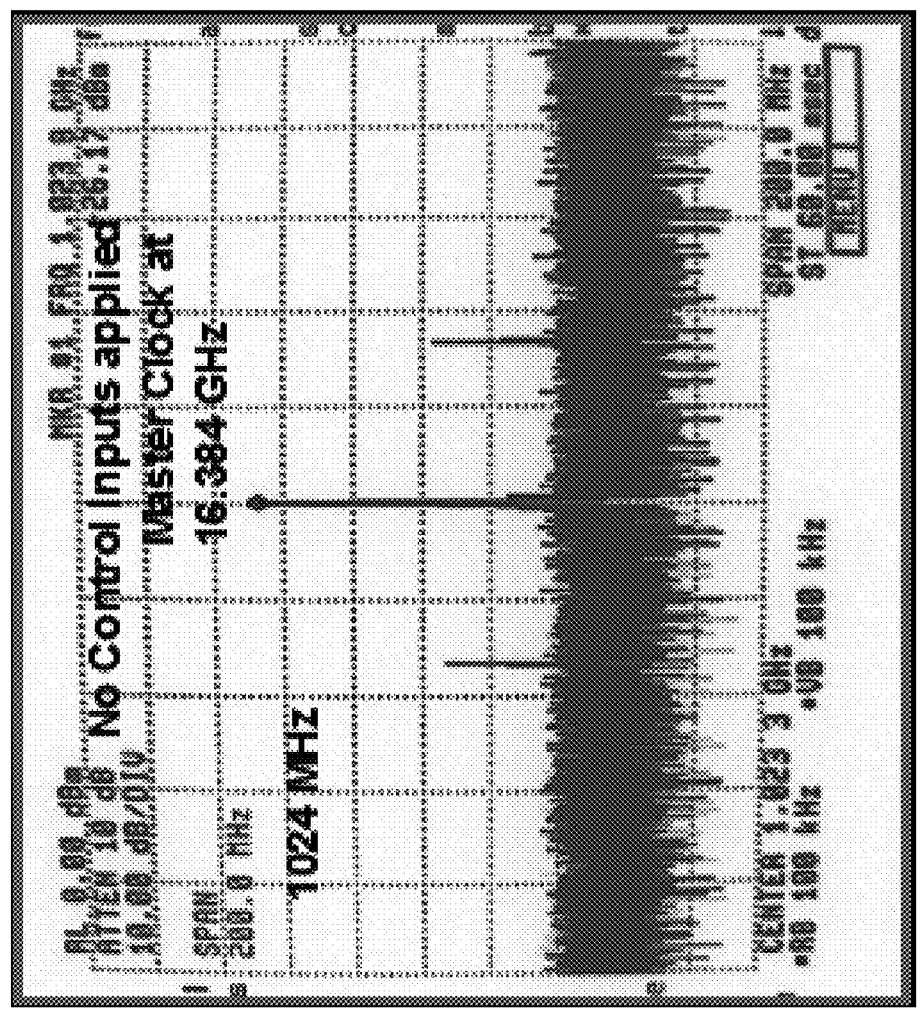
FIGS. 12A, 12B and 12C show illustrations of high-speed test results with a master clock frequency of $f_m$=16.384 GHz.
Figure 12B:
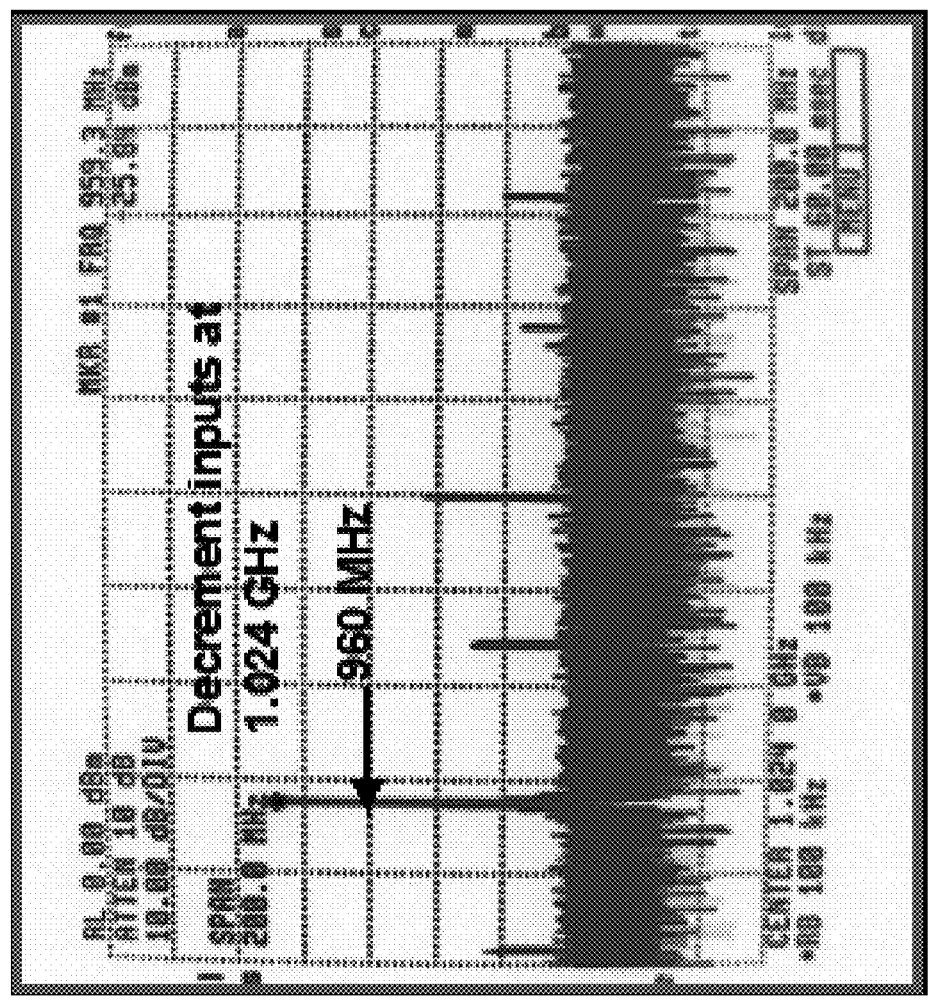
Figure 12C:
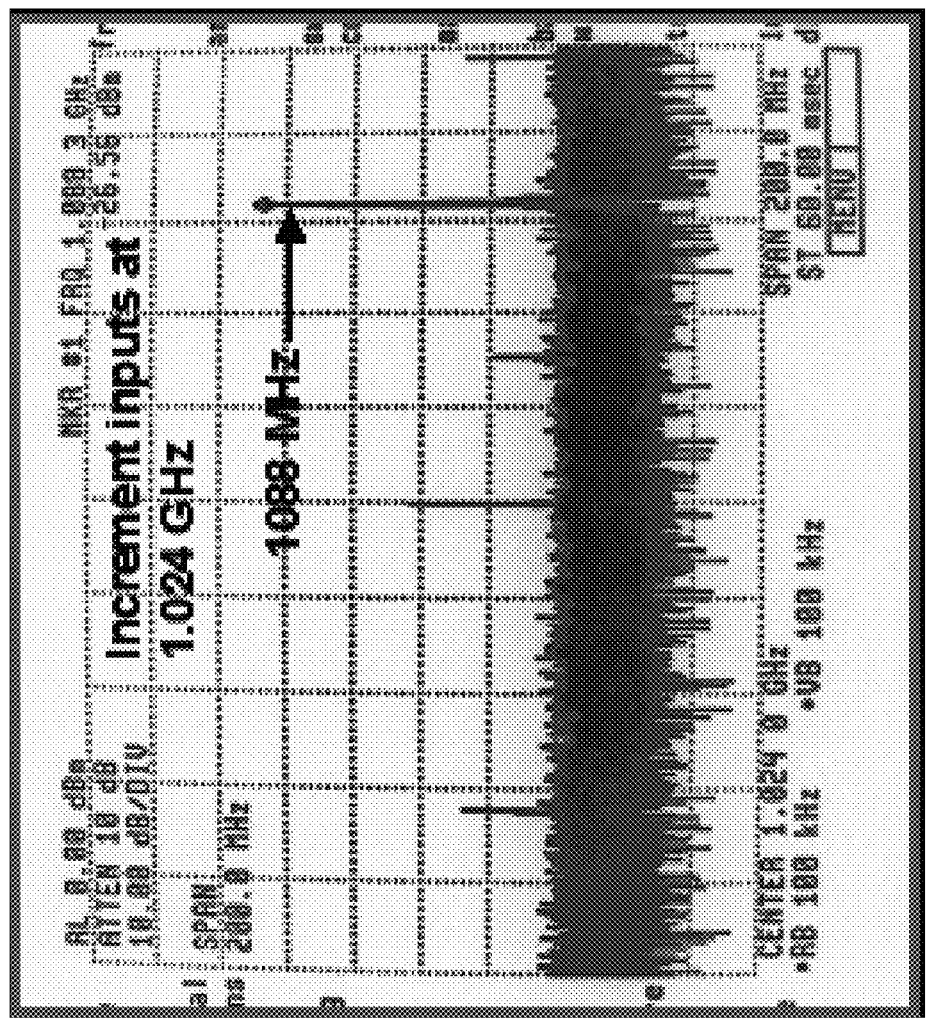

The results of a high-speed test of a circuit of FIG. 3D are shown in FIGS. 12A, 12C and 12C, with a master clock frequency of $f_m$=16.384 GHz. The power spectrum of the output is shown, with and without input control signals. When there is no input, the output clock frequency is at $f_c=f_y/16$=1024 MHz. With an increment input at 1024 MHz, the output frequency is shifted up to 1088 MHz, a fractional increase of 1/16th. With a decrement input at 1024 MHz, the output frequency is shifted down to 960 MHz, a fractional decrease of 1/16th. This is consistent with expectations, and shows how the phase rotator may also be used as a digitally controlled frequency shifter.

In one application of the phase rotator, it is used as part of a direct digital synthesizer.

Figure 13:
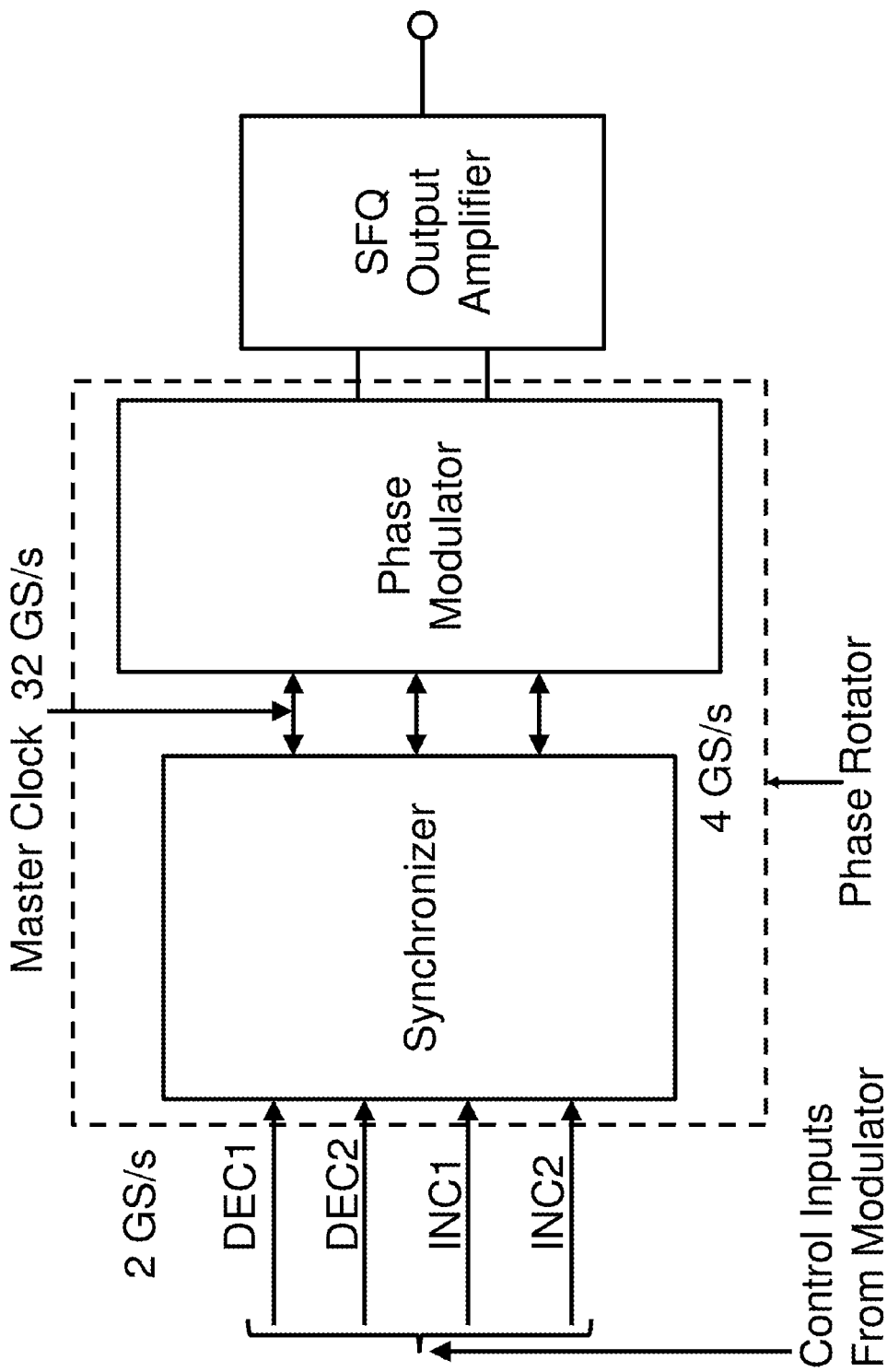
FIG. 13 shows the use of the phase rotator as part of a direct digital synthesizer.

FIG. 13 shows the use of the phase rotator as part of a waveform generator. The generator comprises a phase rotator, which drives an SFQ output amplifier. This circuit will create an analog waveform from a time-varying signal in digital form. The phase rotator employs a high resolution Digital-To-Phase Converter, in order to finely locate every single edge of the output signal at the right instant in the time domain. The time resolution of the digital-to-phase converter directly determines the spectral purity of the produced output signal. In the semiconductor industry the phase rotator is routinely used in high speed signaling circuits to generate precisely aligned clocks. In the implementation shown, the transmitter synthesis technique is also embedded in the phase rotator. The outputs of the rotator are used to drive the SFQ Output Amplifier for waveform generation.

Depending on the control input, the rotator is capable to shift the phase of the output pulse stream by either one or two clock periods in any direction. The increment inputs cause a negative phase shift shrinking the time period (phase advance) whereas the decrement inputs cause a positive phase shift increasing the time period (phase delay). To ensure extremely high accuracy, the phase rotator includes a synchronizer that synchronizes the low frequency control inputs to a very high frequency clock. The synchronizer consists of a chain of toggle flip-flops (TFF) to subdivide the master clock into its binary sub harmonics. The control inputs are stored in a latch, clocked by the binary sub harmonic of the master clock whose frequency is equal to the maximum control input frequency. The two increment control inputs at maximum rate of 2 GS/s are multiplexed on a single line to give a maximum rate of 4 GS/s. Similarly the decrement control inputs are multiplexed on a single line. The control inputs are further successively re-latched and read by the higher sub harmonic clock until it is finally read by the master clock itself and passed on to the phase modulator. Depending on these control inputs, the modulator either advances or retards the timing of the output pulse stream by one or two clock periods. FIG. 3D shows the conceptual design of the phase modulator used in this application.

To produce a synthesized signal, the phase rotator digitally modulates a pulse train. The modulated pulse train can then be amplified and passed through a low pass filter to generate an analog signal.

The design of the SFQ Output Amplifier is disclosed in U.S. Pat. No. 5,936,458.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A cascaded direct digital synthesizer, configured to generate a radio frequency signal, comprising:
    a plurality of digital control input ports, each digital control input port being configured to receive a respective digital signal comprising pulses, comprising a plurality of advance phase control input ports, each configured to receive an advance phase control signal and a plurality of retard phase control input ports each configured to receive a retard phase control signal;
    a first synchronizer, configured to synchronize a first portion of the pulses received at the plurality of digital control input ports with respect to an input digital signal comprising a sequence of pulses of the digital input signal having a rate in excess of 1 gigasamples per second, to produce a first set of synchronized pulses;
    a first digital phase modulator, configured to receive the respective first set of synchronized pulses and the sequence of pulses of the digital input signal, and to produce selectively in dependence thereon a first digitally modulated pulse train, comprising logic configured to insert a pulse into the pulse stream in response to the advance phase control signal, and to suppress a pulse from the pulse stream selectively in response to the retard phase control signal;
    a second synchronizer, configured to synchronize a second portion of the pulses received at the plurality of digital control input ports with respect to the input digital signal comprising the sequence of pulses of the digital input signal having the rate in excess of 1 gigasamples per second, to produce a second set of synchronized pulses; and a second digital phase modulator, configured to receive the respective second set of synchronized pulses and the first digitally modulated pulse train, and to produce selectively in dependence thereon a second digitally modulated pulse train, comprising logic configured to insert a pulse into the pulse stream in response to the advance phase control signal, and to suppress a pulse from the pulse stream selectively in response to the retard phase control signal.

2. The cascaded direct digital synthesizer according to claim 1, further comprising a filter and an output amplifier configured to convert the digitally modulated pulse train to a radio frequency analog signal.

3. The cascaded direct digital synthesizer according to claim 1, wherein each of the first digital phase modulator and the second digital phase modulator comprises at least one Josephson junction.

4. The cascaded direct digital synthesizer according to claim 1, wherein each of the first synchronizer and the second synchronizer comprises at least one Josephson junction.

5. The cascaded digital synthesizer according to claim 1, wherein the input signal comprises a clock signal having the clock rate in excess of 1 gigahertz, further comprising a clock input configured to receive the clock signal.

6. The cascaded direct digital synthesizer according to claim 1, wherein each digital control input port is configured to receive a digital pulse train at a rate in excess of 1 gigasamples per second.

7. The cascaded direct digital synthesizer according to claim 1, wherein the digitally modulated pulse train comprises a sequence of single flux quantum (SFQ) pulses.

8. The cascaded direct synthesizer according to claim 1, wherein the first digital phase modulator comprises a decimator configured to generate a decimated pulse stream.

9. The cascaded direct digital synthesizer according to claim 1, wherein the plurality of digital control input ports comprise an advance phase control input port configured to receive an advance phase control signal and a retard phase control input port configured to receive a retard phase control signal.

10. The cascaded direct digital synthesizer according to claim 9, wherein each of the first digital phase modulator and the second digital phase modulator comprises: a decimator configured to generate a decimated pulse stream from the sequence of pulses: and logic configured to at least one of: insert a pulse into the decimated pulse stream, and suppress a pulse from the decimated pulse stream.

11. The cascaded direct digital synthesizer according to claim 1, comprising at least two Josephson junctions on an integrated circuit.

12. The cascaded direct digital synthesizer according to claim 1, wherein at least one of the plurality of digital control input ports is configured to receive a multi-bit digital pulse signal.

13. A cascaded direct digital synthesizer, configured to generate a radio frequency analog signal, comprising a plurality of cascaded stages, each stage comprising:

a plurality of respective digital control input ports, each digital control input port being configured to receive a respective signal for controlling a modulation by the respective stage;

a synchronizer, configured to synchronize the plurality of digital control input ports with respect to an input signal to the respective stage; and a digital phase modulator, configured to selectively produce a modulated pulse train, selectively in dependence on the respective signals for controlling a modulation by the respective stage, and the input signal to the respective stage being an input signal from an input signal port for a first respective stage, and the modulated pulse train from a preceding respective stage for subsequent stages.

14. The cascaded direct digital synthesizer according to claim 13, wherein each stage comprises at least one Josephson junction.

15. The cascaded direct digital synthesizer according to claim 13, wherein the modulated pulse train comprises a sequence of single flux quantum pulses.

16. The cascaded direct digital synthesizer according to claim 13, wherein the input signal port is configured to receive a digital pulse train at a rate in excess of 1 gigasample/sec, further comprising an output amplifier configured to convert the modulated pulse train of a final stage to a radio frequency analog signal.

17. The cascaded direct digital synthesizer according to claim 13, wherein the plurality of respective digital control input ports comprise an advance phase control input port configured to receive an advance phase control signal and a retard phase control input port configured to receive a retard phase control signal, further comprising a decimator configured to generate a decimated pulse stream.

18. A method for directly synthesizing a digital radio frequency signal, comprising:

providing a cascaded direct digital synthesizer, configured to generate a radio frequency analog signal, comprising a plurality of cascaded stages, each stage comprising:
a plurality of respective digital control input ports, each digital control input port being configured to receive a respective signal for controlling a modulation by the respective stage;
a synchronizer, configured to synchronize the plurality of digital control input ports with respect to an input signal to the respective stage; and
a digital phase modulator, configured to selectively produce a modulated pulse train, selectively in dependence on the respective signals for controlling a modulation by the respective stage, and the input signal to the respective stage being an input signal from an input signal port for a first respective stage, and the modulated pulse train from a preceding respective stage for subsequent stages;

receiving a respective control signal pulse stream for controlling a modulation of each respective stage, from each of a plurality of digital control input ports, each respective control signal pulse stream having a pulse stream control clock rate of at least 1 gigahertz;

digitally synchronizing the plurality of control signal pulse streams with respect to an input signal comprising a sequence of pulses having an input signal clock rate in excess of 1 gigahertz, to produce a plurality of synchronized control signal pulse streams; and digitally modulating a phase of the sequence of pulses of a respective input signal to each stage, to produce selectively in dependence thereon a respective digitally modulated pulse train, selectively dependent on the respective plurality of synchronized control signal pulse streams, wherein a respective digitally modulated pulse train of a first stage is received as the respective input signal of a subsequent stage.

19. The method according to claim 18, further comprising digitally decimating the sequence of pulses with a decimator, wherein said digitally modulating the phase comprises addition of at least one pulse to, or suppression of at least one pulse from, the input signal.

\* \* \* \* \*